United States Patent [19]

Krabbe

[11] 3,868,583

[45] Feb. 25, 1975

[54] HIGH-PERFORMANCE SOLID-STATE AMPLIFIER SYSTEM

[75] Inventor: Heinrich F. Krabbe, San Jose, Calif.

[73] Assignee: Analog Devices, Inc., Cambridge, Mass.

[22] Filed: Sept. 29, 1972

[21] Appl. No.: 293,438

Related U.S. Application Data

[63] Continuation of Ser. No. 61,653, Aug. 6, 1970, abandoned.

[52] U.S. Cl. .................... 330/30 D, 330/69, 330/24

[51] Int. Cl. .................... H03f 3/68

[58] Field of Search .................... 330/30 D, 69

[56] References Cited

UNITED STATES PATENTS

| | | | |
|---|---|---|---|
| 3,434,069 | 3/1969 | Jones | 330/30 D |
| 3,733,559 | 5/1973 | Thorpe | 330/69 X |

*Primary Examiner*—Nathan Kaufman
*Attorney, Agent, or Firm*—Bryan, Parmelee, Johnson & Bollinger

[57] ABSTRACT

A monolithic amplifier having a pair of input transistors forming a balanced differential input stage including a gain resistor arranged to conduct current proportional to the input signal and a feedback-controlled differentially-operated pair of current generators to maintain balanced current flow in the input transistors. Any unbalancing in the input stage is amplified to control a pair of balanced feedback transistors having a pair of current generators for setting the current flow therethrough, any unbalance between the feedback transistors being amplified to control both the input and the feedback current generators in unison to maintain null conditions in the feedback circuitry.

3 Claims, 2 Drawing Figures

HIGH-PERFORMANCE SOLID-STATE AMPLIFIER SYSTEM

This is a continuation of application Ser. No. 61,653, filed Aug. 6, 1970, now abandoned.

This invention relates to solid-state amplifiers. More particularly, this invention relates to high-performance linear amplifiers especially adapted for construction in monolithic form.

A considerable number of applications in the field of electronics require amplifiers meeting exceptionally stringent specifications. Prominent in this regard are the requirements of high input impedance (ideally infinite), and linear drift-free performance over wide ranges of input signal and varying environmental conditions. Many solid-state amplifier designs have been developed over the years in an effort to approach such desired specifications, including the well known conventional operational-amplifier configurations, as well as various complex modifications of such configurations adapted to increase still further the common-mode rejection, to improve symmetry of the input circuit, and so forth.

Although many of these prior designs have been used commercially with at least some degree of success, no single design has been entirely satisfactory. Certain of the prior art amplifiers, for example, have been overly expensive to manufacture, for various reasons such as the number of separate elements required, the need for very close tolerances, and so on. On the other hand, designs which are relatively simple and inexpensive to manufacture typically have suffered from undesirable performance limitations.

Accordingly, it is an object of this invention to provide a solid-state amplifier which is superior to those available heretofore. Still another object of this invention is to provide such an amplifier which is especially adapted for economical construction in monolithic form. A more specific object of the invention is to provide an amplifier having high performance capabilities combined with flexibility in use.

Figure 1:
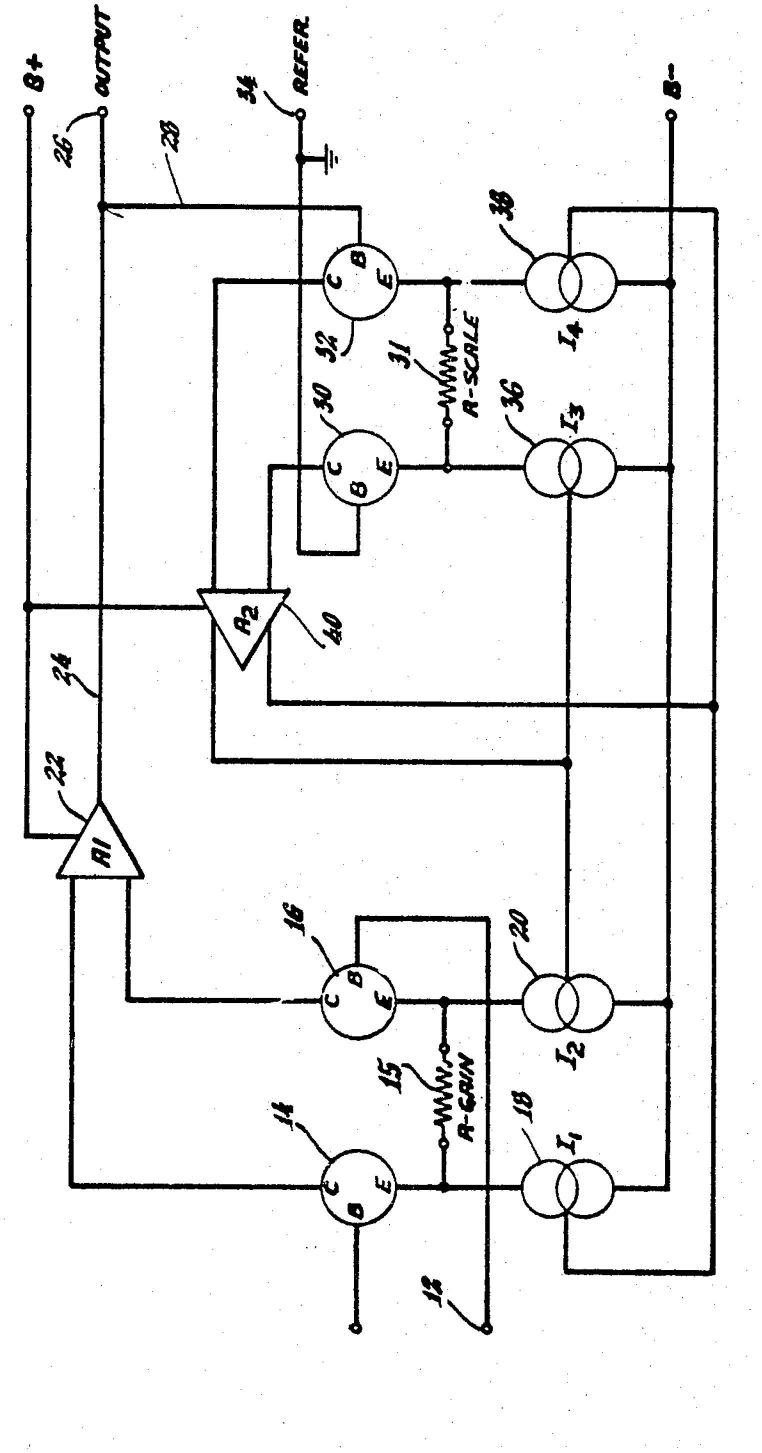
Figure 2:
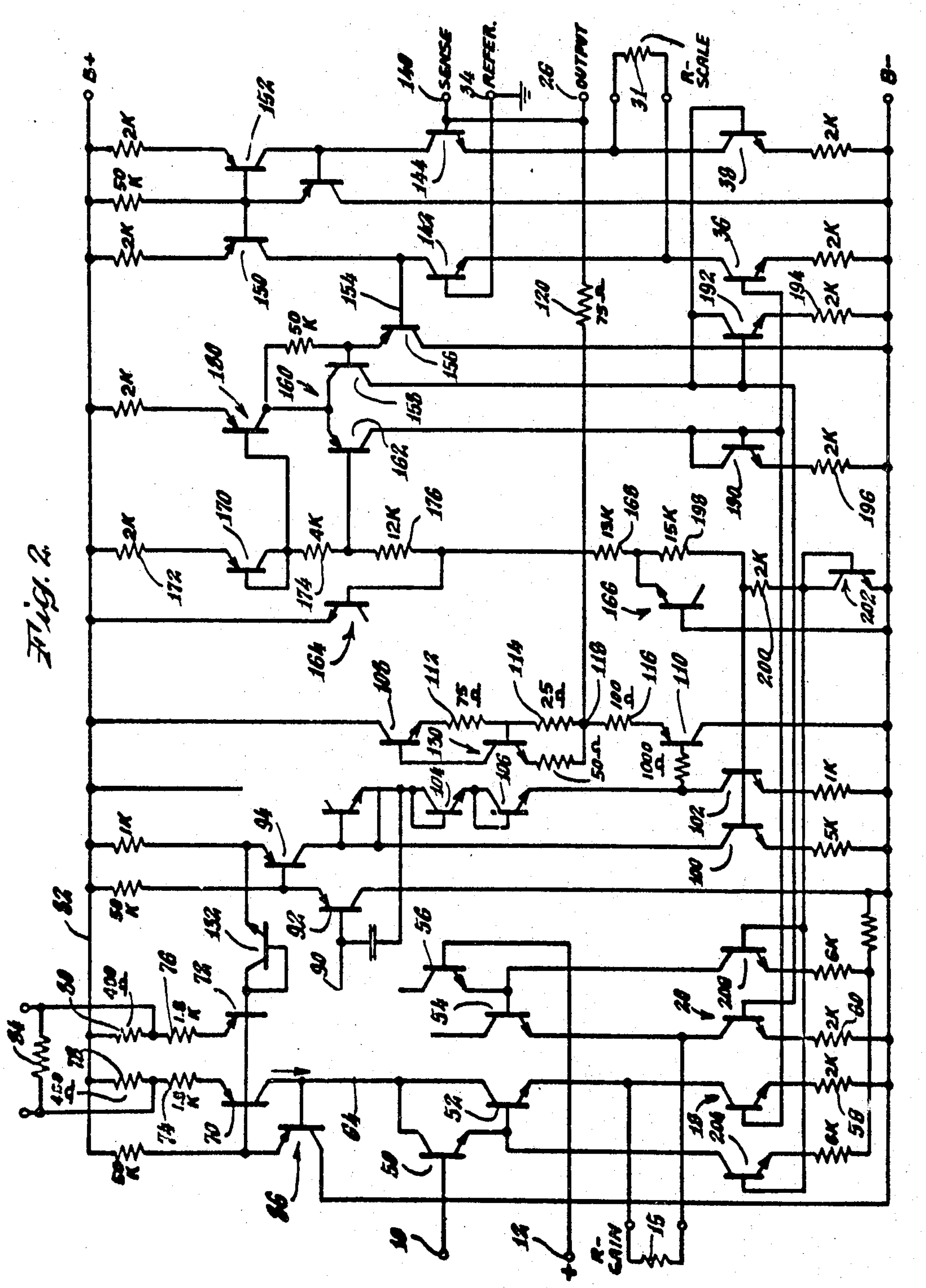

Other objects, aspects and advantages of the invention will in part be pointed out in, and in part apparent from, the following description considered together with the accompanying drawings, in which:

FIG. 1 is a block diagram illustrating the general principles of operation of an amplifier in accordance with this invention; and FIG. 2 is a schematic diagram showing the details of one amplifier circuit in accordance with this invention.

Referring now to FIG. 1, the amplifier comprises a pair of input terminals 10 and 12 connected respectively to the control elements (bases) of a pair of input transistors 14 and 16 the emitters of which are connected together by a gain-setting resistor 15 (e.g., 100K). The two input transistors are balanced, and arranged to conduct equal current when there is zero voltage between the input terminals. These input transistors are arranged to present a differential input configuration, such that when a voltage is applied to terminals 10 and 12, it will tend to increase the current through one transistor (which one depends upon the polarity of the input voltage) and simultaneously tend to reduce the current through the other transistor.

Connected in series with each of the input transistors 14 and 16 is a corresponding current generator 18 and 20, arranged to control the magnitude of current flow through the associated input transistors by means of a negative feedback circuit to be described hereinafter. The collectors of the input transistors 14 and 16 are connected to respective terminals of a high-gain differential amplifier 22, having a single-ended output circuit 24 connected to an output terminal 26. Any unbalance of the two input transistors will result in a corresponding output signal on terminal 26.

The voltage developed at the output terminal 26 is directed via line 28 to a pair of balanced feedback transistors 30 and 32 which, like the input transistors 14 and 16, are arranged in a differential configuration. Similarly, the emitters of the two feedback transistors are connected together by a so-called scale resistor 31 (e.g., 100K). The voltage from terminal 26 is applied directly to the control element (base) of one transistor 32, while the control element of the other transistor 30 is connected to a reference terminal 34, e.g., ground. With this arrangement, development of a positive voltage on terminal 26 will tend to increase the current through transistor 32 and to decrease the current through the other transistor 30.

Current through the two feedback transistors 30 and 32 is controlled by a corresponding pair of current generators 36 and 38 which are identical to, and operate in unison with, the first-mentioned pair of current generators 18 and 20. The control elements of one set of current generators 20, 36 are connected together, and the control elements of the other set 18, 38 similarly are connected together. Thus, any change in current through generator 20 (or 18) will be matched by a corresponding and equal change of current through the associated generator 36 (or 38), so that the latter generators can be said to track the first pair of generators.

All of these current generators 18, 20; 36, 38 are controlled by the differential output of a second high-gain amplifier 40, serving as a feedback amplifier, and having a differential input coupled to the collectors of the two feedback transistors 30 and 32. Accordingly, when a voltage is developed at the output terminal 26, the differential change of currents through the feedback transistors will produce a corresponding change in output of the amplifier 40, and this in turn causes a readjustment of the currents through all four current generators 18, 20; 36, 38, so as to reestablish matched currents through the respective pairs of transistors 14, 16; 30, 32. The current generators will readjust to provide a differential current equal to the input voltage divided by the gain resistor, and the output voltage will change by an amount equal to the change in differential current multiplied by the scale resistor.

To illustrate with specific numbers the manner in which the overall amplifier works, assume that the quiescent (i.e., zero input) current through each of the transistors 14, 16; 30, 32 is set at 200 micro-amps, that the gain and scale resistors 15 and 31 both are 100K ohms, and that an input signal of ten volts is applied to the input terminals 10 and 12. Under these circumstances, there will be developed across the gain resistor 15 a 10 volt signal (ignoring minor offsets in the associated transistors 14, 16), and the current through the first transistor 14 will tend to increase while the current through the other transistor 16 will tend to decrease.

If there were no feedback, the amplifier 22 normally would be driven to saturation by a 10 volt input signal. However, as the currents through the two transistors 14 and 16 tend to become unbalanced, the output of amplifier 22 changes, thereby tending to unbalance the outputs of the feedback transistors 30, 32. This in turn alters the output of the second amplifier 40 which correspondingly readjusts the current generators 18 and 20 so as to tend to restore the original balanced current condition with respect to the amplifier 22, i.e., the negative feedback tends to maintain a null at the input of amplifier 22. Thus, transistors 14, 16 continue to pass 200 micro-amps (except for the very slight change in current needed to produce the tiny error signal component required to develop the nulling feedback signal).

Since the second pair of current generators 36 and 38 are controlled by the output of amplifier 40, so as to operate in unison with the first pair of current generators, the currents through the second generator pair will similarly be reset to new levels by the feedback action.

As previously noted, the input signal of ten volts on input terminals 10 and 12 will cause a signal substantially equal to 10 volts to appear across the gain resistor 15. Thus, in that circumstance, the current flowing through the gain resistor will be 100 micro-amps (i.e., 10 volts divided by 100K). Consequently, to reach the new stable condition described above, it will be clear that the first two current generators 18, 20 must have been unbalanced by the same amount (100 micro-amps each) in order to maintain the input currents to amplifier 22 equal, i.e., in order to hold the current through transistors 14 and 16 at 200 micro-amps. To achieve that result, the output of one current generator 18 will drop from the original 200 micro-amps to 100 micro-amps, and the output of the other generator 20 will increase from 200 to 300 micro-amps.

Since the second pair of current generators 36, 38 always tracks the first pair of generators 18, 20 identically (because they are constructed identically and operate into effectively identical circuits), the currents through the second pair of generators 36, 38 similarly will change to 300 and 100 micro-amps respectively. However, the current passing through the feedback transistors 30, 32 must remain at substantially the original level (200 micro-amps), due to the negative feedback action which tends to null the input to the differential amplifier 40. Accordingly, with the current generators 36, 38 unbalanced to 300 and 100 micro-amps, respectively, the current through the scale resistor 31 must be 100 micro-amps in order to maintain balanced currents through the feedback transistors.

Since the scale resistor 31 has an assumed resistance of 100K, the current flow of 100 micro-amps will develop ten volts across this resistor. This voltage is a measure of the output voltage appearing on output terminal 26, i.e., the two voltages will be essentially the same, except for small offset mismatches in the input transistors 14, 16. Consequently, since the output and input voltages are equal, the overall amplifier gain is unity for the assumed equal ohmic resistances of resistors 15 and 31.

It will be evident that the net amplifier gain is determined by the ratio of resistors 15 and 31. Scale resistor 31 should remain fixed at the value selected for proper operation with the associated circuit elements. The gain resistor 15 may however be changed to correspondingly alter the amplifier gain. For example, by selecting resistors between 100K and 100 ohms, the gain can be changed over the range of unity to 1,000.

FIG. 2 presents a detailed circuit diagram of the embodiment of the invention shown in block format in FIG. 1. In FIG. 2, each section of the differential input circuit includes a pair of transistors 50, 52; 54, 56, the bases of which are controlled by the input voltage applied to terminals 10 and 12. The initial input transistors 50, 56 provide base drive for the principal input transistors 52, 54. The emitters of transistors 52, 54 are connected together by a gain resistor 15, e.g., 100K ohms. These emitters also are connected to respective current generators 18 and 20, consisting in this case of transistors having their emitters connected through associated resistors 58, 60 to the negative supply lead 62.

The collectors of input transistors 52, 54 are connected through respective leads 64, 66 to a pair of amplifier transistors 70, 72 having load resistors 74, 76 (1.8K); 78, 80 (400 ohms) energized by the positive supply lead 82. The bases of transistors 70, 72 are connected together, thereby assuring that the transistor collector currents will be maintained substantially equal. A seroize resistor 84 is connected between the load resistor junctions to zerioze the amplifier by compensating for various unavoidable resistance or offset mismatches. The bases of transistors 70, 72 also are connected through another transistor 86 to one collector lead 64, to provide circuit symmetry by furnishing base current to transistors 70 and 72, thereby unloading lead 64.

When an input voltage is applied to terminals 10 and 12, the two input transistors 52, 54 react differentially. For example, if a positive voltage is applied to terminal 10, the current through transistor 52 tends to increase, while the current through transistor 54 tends to decrease. The increase in current through the first transistor 52 is accompanied by an increase in the current through transistor 86 and a reduction in the potential of the bases of transistors 70 and 72. The current through the latter transistors correspondingly increases. With an increase in current through transistor 72, and a decrease in current through transistor 54, there is a net increase in the output on lead 90. Thus the transistors 70, 72 serve with the associated input circuitry as a current inverter, producing in collaboration with input transistor 54 a highly amplified signal on output lead 90. This signal is further amplified by cascaded transistors 92, 94 and 96, which are provided with a stabilizing capacitor 98.

The current through the second and third transistors 94 and 96 is furnished by respective current generators 100, 102. Two bias diodes 104, 106 are connected in series with the third transistor 96. A pair of differentially-functioning complementary transistors 108, 110 are driven respectively by the voltages at the remote terminals of the bias diodes. The emitters of the complementary transistors are connected together by a set of bias resistors 112, 114, 116 the balance point 118 of which provides the amplifier output voltage. This balance point is connected through a small (75 ohm) oscillation-damping resistor 120 to the output terminal 26.

Overload protection in the output circuit is provided by a transistor 130 the base of which is connected to the junction between bias resistors 112, 114, and the emitter of which is connected to the balance point 118 through a 50 ohm resistor. A 1,000 ohm resistor is connected in the base circuit of transistor 110 to minimize the possibility of instability. Protection from excessive voltage swings is provided by a diode 132 connected between the base of current inverter transistor 72 and the emitter of transistor 94.

The output terminal 26 is shown connected to a so-called "sense" terminal 140 leading to the base of one of a pair of feedback transistors 142, 144. The base of the other transistor is connected to the "reference" terminal 34, shown grounded, but which may be supplied with a reference voltage for fixing the level of the output signal on terminal 26.

The emitters of the feedback transistors 142, 144 are connected together through the "scale" resistor 31 (100K ohms), and are also connected to a pair of current generators 36, 38, identical to current generators 18, 20 previously mentioned. The collectors of transistors 142, 144 are connected respectively to the two sections of a differential amplifier comprising as the first stage a pair of transistors 150, 152 connected as a current inverter (like transistors 70, 72 previously described). The composite output of these two amplifier sections appears on a lead 154 connected to the base of another transistor amplifier stage 156.

The output of amplifier stage 156 is applied to one section 158 of a differentially-operated amplifier 160 the other section 162 of which is furnished a fixed reference potential. Reference voltages are developed by a pair of series-connected Zener diodes 164, 166 (e.g., approximately 6–9 volts each) connected together by a series resistor 168 carrying the remaining voltage of the 30 volt power supply. The fixed reference potential for the base of transistor 162 is supplied by a voltage-divider circuit connected between the positive lead 82 and resistor 168. This divider circuit includes a bias diode 170 and three resistors 172, 174, 176.

The bias diode 170 in conjunction with resistor 172 provides a fixed base voltage for a current generator 180 which supplies current to both of the differential amplifier sections 158 and 162. Thus the total current through the two amplifier sections is maintained constant, so that an increase in current through one section is matched by an equal decrease in current through the other section.

The outputs of the two amplifier sections 158 and 162 control both pairs of current generators 18, 20; 36, 38 in a differential fashion. That is, when the output of amplifier section 158 increases, there will be corresponding (and identical) increases in current through one set of current generators 20 and 38. Simultaneously, the concomitant decrease in output of the other amplifier section 162 causes corresponding (and identical) decreases in current through the other set of current generators 18 and 36. The collectors of the amplifier sections 158 and 162 also are connected to respective diodes 190, 192 which with the associated resistors 194, 196 provide a current inversion function in cooperation with the corresponding sets of current generators with their interconnected bases. The diodes 190, 192 also furnish temperature compensation for the respective matched sets of current generators.

The lower Zener diode 166 supplies d-c voltage to a pair of voltage-divider resistors 198, 200 connected in series with a bias diode 202. The junction of resistors 198, 200 is connected to the bases of the two current generator transistors 100, 102, previously described, to assure a substantially constant current through these generators. The current through the first generator 100 preferably is fixed at a substantially lower level than through the other generator 102, e.g., in a ratio of 5:1 with the load resistors illustrated.

The voltage across the bias diode 202 is supplied to the bases of a pair of transistors 204, 206 which serve as current generators for the respective transistors 50, 56 in the amplifier input circuit. These two transistors carry very much less current than the principal input transistors 52, 54, so that in analyzing the changes in current in the input circuit the contributions of transistors 50, 56 can safely be ignored without significantly altering the results.

The amplifier disclosed in FIG. 2 operates in the manner described with reference to FIG. 1. Thus a change in voltage at input terminals 10, 12 results in a substantially equal voltage change across the gain resistor 15, and tends to unbalance the current through the two principal transistors 52, 54. These transistors thereby direct a corresponding error signal to the high-gain amplifier comprising the current-inverter 70,72, cascaded amplifiers 92, 94, 96, and the single-ended output amplifier 108, 110.

The resulting change in voltage at output terminal 26 is coupled to the feedback transistors 142, 144 to tend to produce a corresponding differential change in current through those transistors. This change in current serves as an error signal for the feedback amplifier comprising the current inverter 150, 152, transistor 156, and the differential amplifier 160. The differential output of this amplifier is correspondingly changed, so as to alter differentially the base voltages on the two pairs of identical current generators 18, 20; 36, 38. As explained hereinbefore, the output of the current generators changes just the required amount to maintain balanced current conditions in the two input transistors 52, 54, and, similarly, to maintain balanced current conditions in the feedback transistors 142, 144. This change of output of the current generators 36, 38 results in a corresponding change in current flowing through the scale resistor 31, such that (with resistor 31 equal to gain resistor 15) the change in voltage across the scale resistor will equal the change in voltage across the gain resistor. Consequently, the change in output voltage at terminal 26 will equal the change in input voltage at input terminals 10 and 12, for the assumed condition where the gain and scale resistors are equal.

Although specific features of a presently preferred embodiment of the invention have been set forth in detail hereinabove, it is desired to emphasize that this is for the purpose of illustrating one way in which this invention can be utilized, it being understood that many modifications can be made by those skilled in the art to meet the requirements of particular applications. For example, other types of transistor circuit arrangements could be used in the various individual amplifiers forming part of the overall amplifier system. The system also is operable with either bi-polar transistors or FET devices. Still other variations will be apparent from a consideration of the operational requirements of the invention.

I claim:

1. A high-performance solid-state integrated-circuit amplifier comprising:

an input section including a first differential amplifier having first and second differentially-operable transistor amplifiers;

amplifier means responsive to the differential output of said input section to produce an output signal;

first and second differentially-operable current sources connected in series with said first and second transistor amplifiers, respectively, to supply the currents flowing therethrough, respectively;

control terminals for said first and second current sources respectively;

a negative feedback circuit responsive to the output of said amplifier means and producing a feedback signal for said control terminals so as to tend to maintain the current through said first and second transistor amplifiers constant;

said feedback circuit comprising a second differential amplifier including third and fourth differentially-operable transistor amplifiers and having its input coupled to the output of said amplifier means; and third and fourth differentially-operable current sources having third and fourth control terminals driven by said feedback signal together with said first and second control terminals respectively, said third and fourth current sources being connected in series with said third and fourth transistor amplifiers respectively to tend to maintain constant the currents therethrough.

2. An amplifier as in claim 1, including a gain-adjusting resistor connected between said first and second transistor amplifiers to control the relative gain produced by said input section.

3. An amplifier as in claim 2, including a scale resistor connected between said third and fourth transistor amplifiers to control the relative contribution thereof to the feedback action.

* * * * *